WITNESSES:
Bernard R. Giegue
James F. Young

INVENTOR
James D. Finley
BY
Willard R. Crout
ATTORNEY

Jan. 3, 1961 J. D. FINLEY 2,967,220

CIRCUIT INTERRUPTERS

Filed Nov. 18, 1958 6 Sheets-Sheet 2

Jan. 3, 1961 J. D. FINLEY 2,967,220

CIRCUIT INTERRUPTERS

Filed Nov. 18, 1958 6 Sheets-Sheet 3

Jan. 3, 1961 J. D. FINLEY 2,967,220

CIRCUIT INTERRUPTERS

Filed Nov. 18, 1958 6 Sheets-Sheet 4

Jan. 3, 1961 J. D. FINLEY 2,967,220

CIRCUIT INTERRUPTERS

Filed Nov. 18, 1958 6 Sheets-Sheet 6

United States Patent Office 2,967,220

Patented Jan. 3, 1961

2,967,220

CIRCUIT INTERRUPTERS

James D. Finley, Monroeville, Pa., assignor to Westinghouse Electric Corporation, East Pittsburgh, Pa., a corporation of Pennsylvania Filed Nov. 18, 1958, Ser. No. 774,674

7 Claims. (Cl. 200—144)

This invention relates to circuit interrupters in general, and more particularly to arc-extinguishing structures therefor.

A general object of the present invention is to provide an improved arc-extinguishing structure for a circuit interrupter, which will be more effective than arc-extinguishing structures heretofore employed.

A more specific object of the present invention is to provide an improved plate-type arc chute, in which the slot configuration provided in the several plates is such as to render improved performance.

Another object of the invention is to provide an improved arc-chute construction for a circuit interrupter, in which the initially established single arc is moved within the improved arc chute of the present invention, and while moved therein, breaks into two parallel arc portions transversing separate paths within the arc chute, to thereby bring about rapid circuit interruption.

Another object of the invention is to provide an improved arc chute for a circuit interrupter of the spaced-plate type, in which each of a plurality of the plates, or plate portions, has an open first slot opening upon one edge of the plate portion and has the other end of the said first slot closed. In addition, such plates, or plate portions each possesses a second closed slot extending somewhat in the general direction of the first said slot, and by an alternate positioning of the several plate portions the first slots overlie the second slots in contiguously disposed plates, so that arc subdivision into two parallel arc portions results.

Another object of the invention is to provide an improved arc chute of the type specified in the immediately preceding paragraph, in which raised portions, or ribs, extend along the plate portions, on at least one side thereof, between the first and second slots, to prevent the arc moving out of the intended path of travel and through adjacently disposed second slots as a single arc column.

In United States patent application filed October 18, 1956, Serial No. 616,758, now United States Patent 2,871,319, issued January 27, 1959 to Robert C. Dickinson, and assigned to the Westinghouse Electric Corporation, there is disclosed a plate-type chute including a plurality of plate portions, each of which has a pair of elongated adjoining slots open at the entrance portion of the arc chute and having the other ends of the adjoining slots closed. In the Dickinson patent application there is intended the subdivision of a single initially established arc into two parallel arc portions for more rapid circuit interruption.

It is an additional object of the present invention to improve upon the arc chute of the aforesaid Dickinson patent to render more positive arc subdivision within the arc chute.

Further objects and advantages will readily become apparent upon reading the following specification taken in conjunction with the drawings, in which.

The present invention relates to an improved arc chute for a circuit interrupter, and constitutes a desired improvement over the arc-chute design disclosed in the aforesaid Patent 2,871,319 by Robert C. Dickinson. In the Dickinson arc chute, there is employed a plurality of refractory plates, each having two inverted V-shaped slots. An arc, established between the separable contacts, is moved, under the influence of a magnetic field, into one set of slots of the Dickinson structure at random. The arc, in rising in one set of slots, becomes increasingly unstable due to the elongation and restriction of the arc column, and as the result of an expanding volume of ionized gases impinging on the second set of slots, will eventually establish itself in a parallel path through the second set of slots, thus dividing the original single arc into two parallel arcs. Laboratory investigation supports the premise that an arc can be made to subdivide into two parallel arc paths under appropriate conditions, but that under other conditions, the arc may never occur in the second slot, or it may transfer from one slot to the other slot.

The improvement of the present invention largely resides in the elimination of the random selection of slots by the arc, with the establishment of more favorable conditions for dividing the initially established single arc into two parallel arc portions, and provides a more practicable design for the refractory plates from a mechanical strength standpoint.

Figure 1:
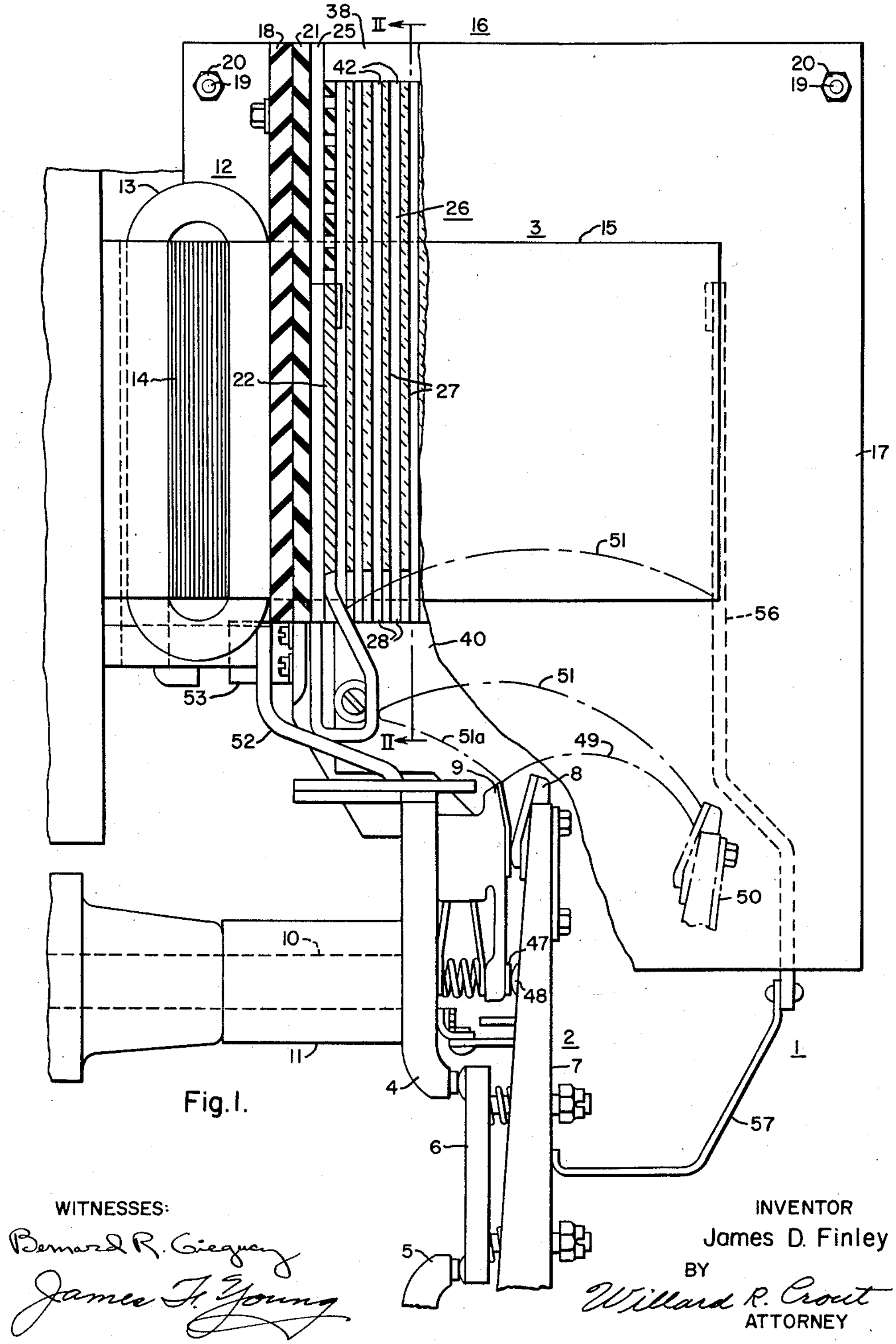
Figure 1 is a side elevational view, partially in vertical section, of an arc chute employing the principles of the present invention, with the contact structure shown in the closed-circuit position.

With reference to Fig. 1, the reference numeral 1 generally designates a circuit interrupter including contact structure, generally designated by the reference numeral 2, and a magnetic blowout type of arc-chute structure, generally designated by the reference numeral 3. As well-known by those skilled in the art, the circuit interrupter 1 functions to establish an arc across the separated contact structure 2, which established arc is moved upwardly by the natural looping effect of the arc itself, coupled with the magnetic blowout field, to become extinguished within the arc-chute structure 3.

More specifically, the contact structure 2 includes a relatively stationary main contact 4 spaced from another main contact 5, which contacts 4 and 5 are bridged, in the closed-circuit position as shown in Fig. 1, by a conducting bridging member 6, the latter being carried by a rotatable contact arm 7. The rotatable contact arm 7 rotates about a stationary axis, not shown, which is in electrical contact with the lower main contact 5, as well understood by those skilled in the art. At the upper extremity of the rotatable contact 7 is a movable arcing contact 8, cooperable with a relatively stationary arcing contact 9, the latter being affixed to the upper main contact 4. As shown, the upper main contact 4 is secured to the outer end of a terminal stud 10, which extends through an insulating bushing 11. The insulating bushing 11 is supported upon a suitable supporting framework, not shown.

The arc-chute structure 3 includes a magnetic blowout device, generally designated by the reference numeral 12, which includes a magnetizing coil 13, encircling a core 14, the latter making abutting contact with a pair of laterally extending magnetic pole plates 15. As shown, the core 14 and the pole plates 15 are preferably of laminated construction to minimize magnetic losses due to the circulation of eddy currents.

The core 14 and the magnetic pole plates 15 generally straddle an arc chute, generally designated by the reference numeral 16, which includes a pair of insulating side support plates 17. Disposed between the insulating support plates 17, at the opposite ends thereof, is a pair of insulating channel members 18, only one of which is shown in Fig. 1. The channel members 18 are secured by bolts 19 and nuts 20 to the side support plates 17.

As shown in Fig. 1, it will be observed that disposed between the side support plates 17 and immediately adjacent to the channel strip 18 is a support plate 21, which carries an inner arc horn 22. The arcing horn 22 is spaced away from the insulating support plate 21 by screws and tubular spacers, not shown. Additional insulating strips 25 space a unitary plate stack 26 away from the support plate 21.

The unitary plate stack 26, which is formed from a plurality of spaced, suitably configured, insulating plates 27, has spacing strips 28, formed of sections of asbestos rope, functioning to maintain the slotted plates 27 a fixed distance apart.

Figure 3:
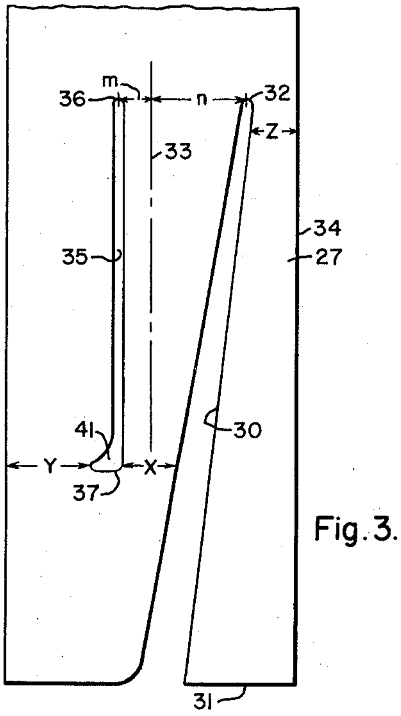
Fig. 3 is a somewhat enlarged fragmentary plan view of one of the plate portions employed in the arc chute of Fig. 2.
Figure 6:
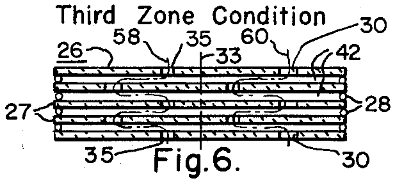
Fig. 6 illustrates a further position of the parallel arc portions at a horizontal level within the arc chute indicated by the line VI—VI of Fig. 2.

With reference to Fig. 3, which fragmentarily shows, in somewhat enlarged fashion, one of the insulating plates, or plate portions 27, it will be noted that there is provided an open, elongated, tapered first slot 30, extending upwardly from the lower narrow edge 31 of the plate 27. The upper end of the tapered first slot 30 is closed, as at 32, and is spaced by the distance $n$ from the center line 33 of the plate 27. In this particular plate construction, it will be noted that the first slot 30 extends generally in the direction of arc travel and toward the right, as shown in Fig. 3, more closely approaching the side edge 34 of the plate 27.

As shown in Fig. 3, the plate 27 also has a second, closed, elongated slot 35, both the upper and lower ends 36, 37 thereof being closed. The upper closed end 36 of the second slot 35, toward the exhaust end 38 (Fig. 1) of the arc chute 16, is spaced a distance "$m$" from the center line 33 of the plate 27. Also it will be noted that the lower end of the second slot 35 toward the entrance end 40 of the arc chute 16 has an enlarged portion 41, as shown in Fig. 3.

In the assembly of the arc chute 16, the plates 27 are alternated, or staggered, throughout the length of the arc chute 16, so that the open first slot 30 in one plate 27 extends to the right of the center line 33 of the plate 27, whereas the open first slots 30 of the immediately contiguously disposed plates 27 are positioned on the opposite side of the center line 33 of the adjoining plates.

Figure 2:
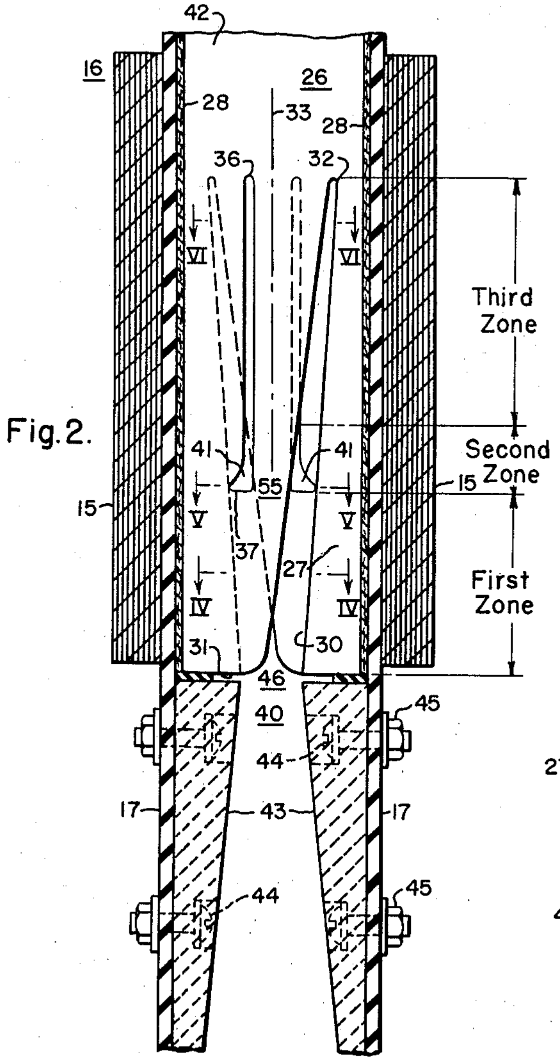
Fig. 2 is a fragmentary vertical sectional view taken through the arc chute of Fig. 1 along the line II—II thereof, with the contact structure omitted.

With reference to Fig. 2 of the drawings, which shows a staggered assembly of such plates 27, it will be noted that the open first slot 30 of the front plate 27 substantially overlies the enlarged portion 41 of the second closed slot 35 of the plate immediately below the front plate 27 shown in Fig. 2. Likewise, the enlarged portion 41 of the second closed slot 35 of the front plate 27 in Fig. 2 overlies the first open slot 30 of the plate 27 immediately behind the front plate 27. Also the plates 27 are spaced apart by the asbestos rope spacers 28 to provide a plurality of venting passages 42 therebetween, as indicated in Figs. 1, 4–6 of the drawings. In practice, the several plates 27 and the asbestos rope sections 28 are cemented together, in a preliminary process, so that a unitary, cemented, plate stack 26 results. This unitary plate stack 26 may be bodily handled, as a stack unit, during subsequent assembly steps.

As shown in Fig. 2, a pair of arc shields 43 are bolted by bolts 44 and nuts 45 to the side insulating support plates 17. The spaced arc shields 43 are tapered inwardly, as shown in Fig. 2, leading gradually into a zig-zag arc passage 46 provided by the open ends of the first slots 30 of the several plates 27. The entering zig-zag arc passage 46 is, of course, disposed adjacent the entrance end 40 of the arc chute 16.

The opening operation of the circuit interrupter 1 will now be described. During the opening operation, the rotatable contact arm 7 is rotated in a clockwise direction about its stationary pivot axis, not shown, by a suitable mechanism, which forms no part of the present invention. The conducting bridging bar 6 first separates from the stationary, spaced main contacts 4, 5, thereby compelling the current to pass through a pair of secondary contacts 47, 48 and the arcing contacts 8, 9. The secondary contacts 47, 48 then separate, forcing the current to flow between the arcing contacts 8, 9. Subsequently, the arcing contacts 8, 9 separate, and an arc 49 is established between the relatively stationary arcing contact 9 and the movable arcing contact 8, which is shown in its partly open position at the location 50 in Fig. 1.

Because of the natural looping tendency of the arc 49, it will bow upwardly to the position 51, so that a portion thereof will contact the inner arc horn 22. This portion of the arc is indicated by the dotted line 51*a*. Since the magnetic blowout coil 13 is electrically connected by a connector 52 to the stationary contact 9, and by a jaw-shaped contact 53 to the arc horn 22, it will be obvious that the blowout coil 13 is in electrical parallel across the arc portion 51*a*, which extends between the lower end of arc horn 22 and stationary arcing contact 9.

The impedance offered by the blowout coil 13 to the flow of current is less than that offered by the arc portion 51*a*; consequently, the arc portion 51*a* will become extinguished and the entire current passing through the interrupter 1 will flow through the blowout coil 13. This current flow through the blowout coil 13 will generate a magnetic flux across the arcing space 55 (Fig. 2) between the side magnetic pole plates 15, and will, as a result, force the arc 51, now extending between the arcing horns 22, 56 upwardly into the plate stack 26. The end of the arc 51, terminating at the movable arcing contact 8 has, during this time, of course, transferred to the front arc horn 56, the latter being electrically connected by a flexible connector 57 to the rotatable contact arm 7.

Figure 4:
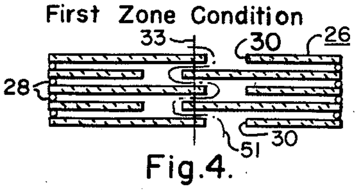
Fig. 4 is a fragmentary sectional view taken through the arc chute of Fig. 2 along the horizontal plane designated by the reference numeral IV—IV of Fig. 2.

As the arc 51 arises into the arc chute 16, it will enter the zig-zag arc passage 46 provided at the entrance portion 40 of the arc chute 16. As the arc 51 is moved upwardly into the arc chute 16 by the magnetic field extending between the side pole plates 15, it moves upwardly within the open first slots 30 in the several plates 27 constituting a first zone within the arc chute. As the arc 51 rises still further into the plate assembly it will be restricted and lengthened, and will follow a tortuous, sinuous path, as indicated fragmentarily in Fig. 4 of the drawings indicating the first zone condition. Fig. 4 indicates a horizontal level of the arc chute taken along the line IV—IV of Fig. 2.

Figure 5:
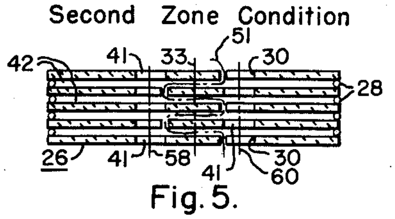
Fig. 5 illustrates, in a manner similar to that of Fig. 4, the arc paths taken at a horizontal level within the arc chute indicated by the line V—V of Fig. 2.

Due to the restriction and elongation of the arc 51, the arc voltage has increased, and the arc 51 becomes progressively more unstable as it rises. When the arc 51 reaches a height, as indicated by the line V—V of Fig. 2, the arc encounters the enlarged aligned portions 41 of the second slots 35 in the intervening plates 27 opening onto its tortuous path. This is shown in Fig. 5 of the drawings and constitutes the second zone condition. The arc 51 at this point can establish itself through a shorter length with less restriction through both aligned paths 58, 60 which are now available and are unobstructed throughout the length of the arc chute. The expanding volume of ionized gases will assist in the transfer of the arc 51 to these new arc paths 58, 60. With the original arc 51 now divided into two parallel secondary arc paths 58, 60, the indvidual secondary parallel arcs 58, 60 will be moved higher into the plate assembly 26, and each secondary arc 58, 60 will be restricted, and lengthened due to the divergence at this point in the stack 26 of the first and second slots 30, 35 provided by the several plates 27 and constituting a third zone condition. By virtue of the lower current in each parallel secondary arc 58, 60 and the doubling of the area of the refractory plates 27, that is encountered by the arcs 58, 60, the localized heating of the plates 27 will be lower than in the case of a single arc path of the same total current. All of these factors contribute to greater ease in the extinction of the secondary arcs 58, 60 in the plate assembly 26.

In the particular design illustrated in Fig. 3 of the drawings, the top 32 of the first slot 30 is located a distance $n$ to the right of the plate center-line 33, and the top 36 of the second slot 35 is located a distance $m$ to the left of the plate center-line 33. It is important that the distance $m$ be no less than ⅓ $n$. The length of the arc at any height in the slots is a function of the offset of the slots at that height. It is a requirement of the plate design illustrated in Fig. 3 that the respective parallel paths 58, 60, in which the arcs are ultimately established, be approximately equal and that no alternate shorter path be available. It will be apparent that if the distance $m$ were very small, that the arcs 58, 60 might move as a single arc to a shorter path, involving only the second slots 35 of all of the plates. It is to avoid this contingency that it is preferable that the distance $m$ be no less than ⅓ $n$.

It will be apparent that by a proper choice of dimensions of the plates 27, sufficient plate material can be maintained in the areas X, Y and Z (Fig. 3) to maintain adequate mechanical strength in the refractory plates.

Figure 7:
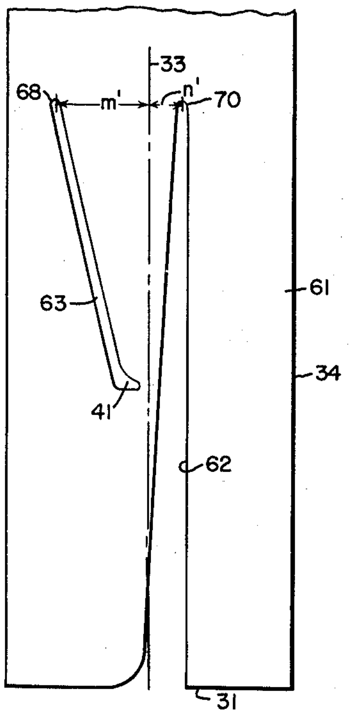
Fig. 7 illustrates fragmentarily, in plan, a modified type of arc-chute plate portion.
Figure 8:
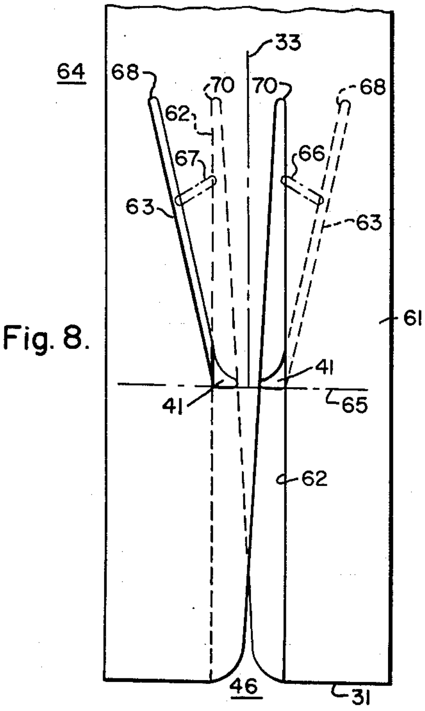
Fig. 8 illustrates the assembly of a plurality of plate portions of the type shown in Fig. 7.

From the foregoing principles, a number of alternate modified arrangements are possible, each arrangement embodying the basic principles of the present invention. For example, Fig. 7 illustrates a modified type of plate 61, in which the relative displacements of the slots 62, 63 from the plate center line 33 have been interchanged from the arrangement illustrated in Fig. 3. In the plate design of Fig. 7 the distance $n'$ must be no less than ⅓ $m'$. The general manner of operation is the same as was described heretofore in connection with the plate assembly illustrated in Figs. 2 and 3 of the drawings. Fig. 8 shows a plate assembly 64 comprising a plurality of alternately arranged plates 61, each of which is shown in Fig. 7. The initially established arc 51 moves upwardly within the zig-zag entering arc passage 46, becoming lengthened in the manner heretofore described in connection with Fig. 4 of the drawings. At the level 65, the first slot 62 overlaps the enlarged portion 41 of the second slot 63, and the single arc 51 breaks into two parallel arc portions 66, 67, each of which is moved upwardly within the plate stack 64. As before, lengthening of the arc portions 66, 67 occurs because of the divergence between the upper ends 68, 70 of the first and second slots respectively. Arc extinction occurs because of diminishment of the current flow through the separate arc portions 66, 67 as compared to a single arc 51, and the increased cooling effect of the plates 61, as caused by a wider dissemination of the heat of the arc throughout a wider surface area of the spaced plates 61.

Figure 9:
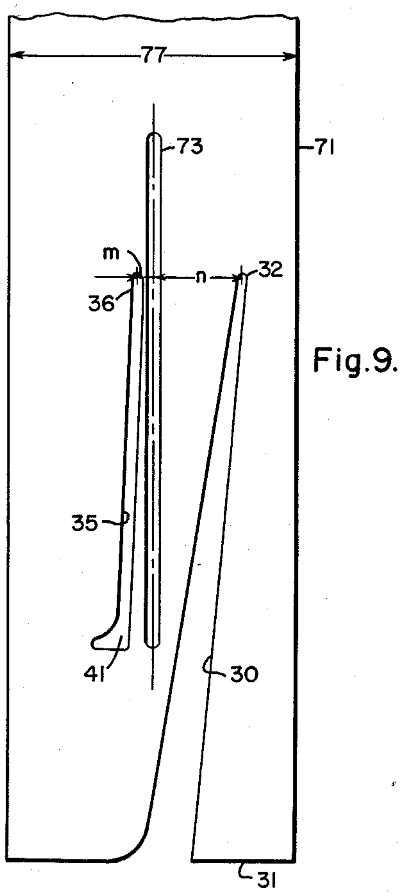
Fig. 9 illustrates fragmentarily a further modified type of plate portion having an embossed ridge thereon.
Figure 11:
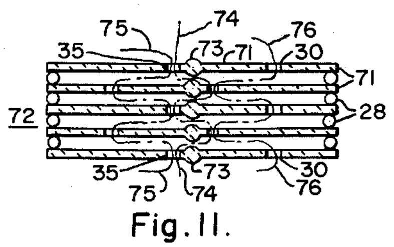
Fig. 11 illustrates a sectional view taken through the assembly of Fig. 10 at the level indicated by the line XI—XI of Fig. 10.
Figure 10:
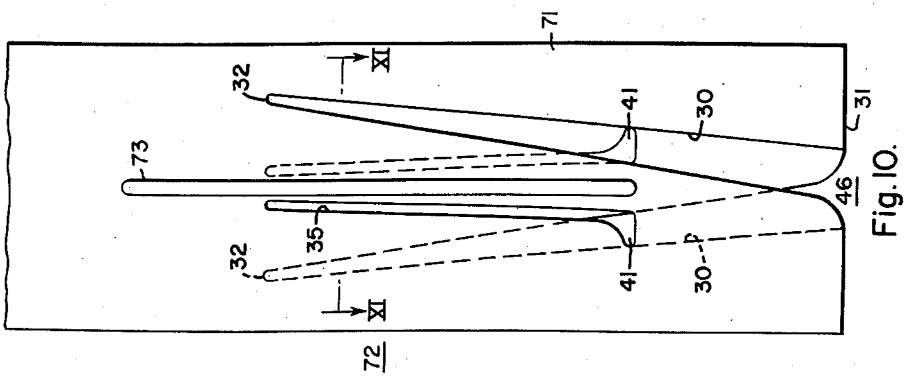
Fig. 10 illustrates an assembly of the plate portions of the type illustrated in Fig. 9.

Figs. 9–11 illustrate another modified type of plate structure. Fig. 9 illustrates a single plate 71, and Fig. 10 illustrates a plurality of plates 71 alternately staggered, forming a plate stack generally designated by the reference numeral 72. With reference to Fig. 9, it will be noted that each insulating plate 71 has a raised rib 73 provided on both sides of the plate 71, as more clearly illustrated in Fig. 11 of the drawings. As will be obvious, this raised rib 73 could be formed either by cementing a longitudinal insulating strip upon the surface of the plate 71, or the plate 71 may be formed by having the raised rib 73 molded integrally with the plate 71 as an embossing ridge. The latter type of construction is illustrated in Fig. 11 wherein the embossed rib 73 is formed as an integral part of the formed plate 71.

In the case of the plates structure 72, illustrated in Figs. 9–11, it will be apparent that because of the provision of the raised ribs 73, the dimension $m$ has been reduced to a value less than ⅓ $n$. Although an alternate path 74, shown in Fig. 11, is shorter than either paths 75 or 76, restrictive influence of the embossed ribs 73 will prevent the establishment of the arcs 75, 76 along the shorter path 74 through successive second slots 35 in the several plates 71.

The alternate arrangement illustrated in Fig. 9 has two possible advantages not available in the Figure 3 construction. For a fixed dimension $n$—$m$ (the length of each parallel arc 75, 76 is a direct function of the offset $n$—$m$) the reduction of the dimension $m$, as permitted by the use of the embossing rib 73, permits an overall reduction in the width of the plate required, as indicated by the dimension illustrated by the reference numeral 77 in Fig. 9. For a fixed overall width and thickness of the plate 71, $n$—$m$ (related to the ultimate arc length) could be increased without weakening the plate physically. This results because of additional mechanical strengthening of the plate structure 72 as permitted by the embossing ribs 73.

Figure 13:
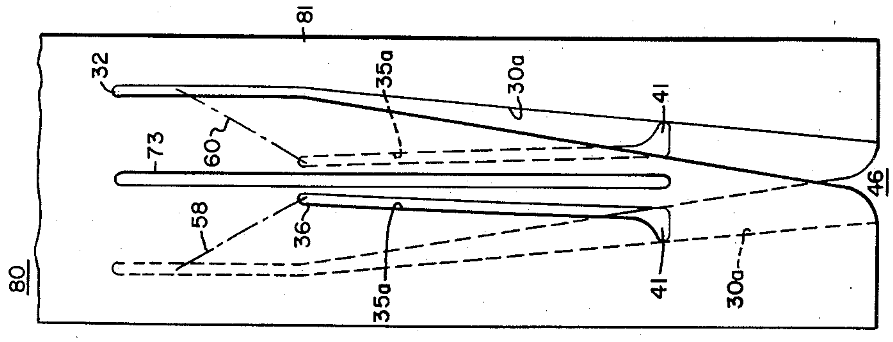
Fig. 13 illustrates an assemblage of the plate portions shown in Fig. 12.
Figure 12:
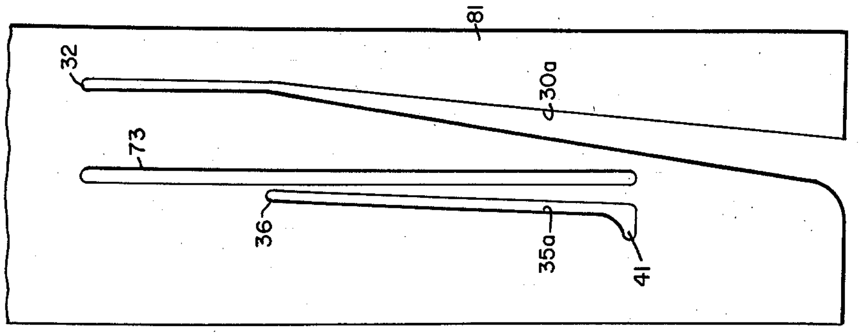
Fig. 12 illustrates another modified type plate portion.
Figure 17:
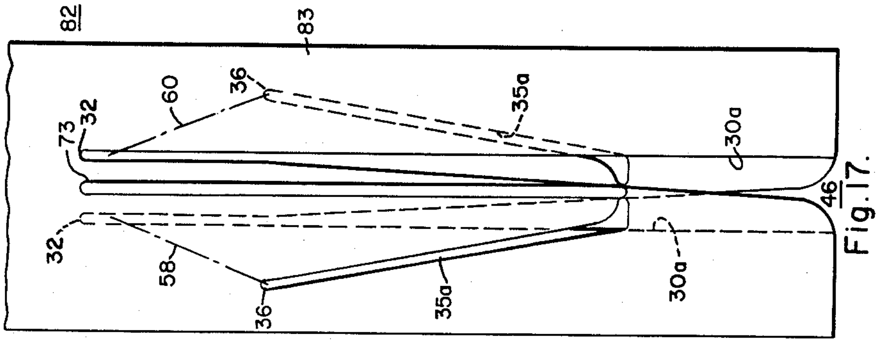
Fig. 17 illustrates an assemblage of the plate portions shown in Fig. 16.
Figure 16:
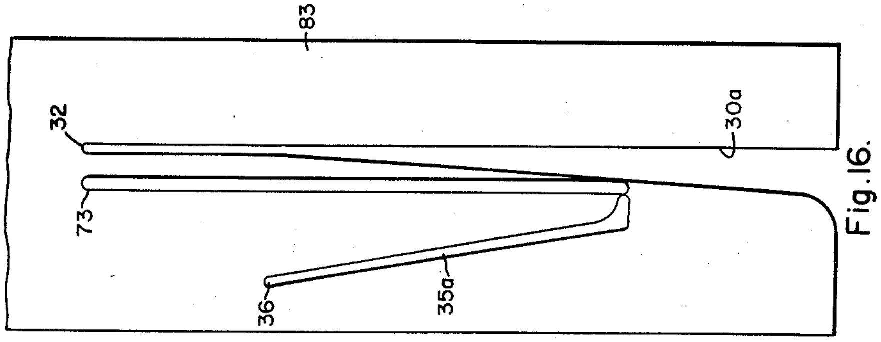
Fig. 16 illustrates a further modified type of plate portion.

Another alternate arrangement is to increase the height of either the first slot 30a or the second slot 35a relative to each other, as illustrated in Figs. 12–13 and Figs. 16 and 17. Fig. 13 illustrates an assemblage 80 of plates 81 of the type shown individually in Fig. 12. The assembly 82 in Fig. 17 illustrates an assembly of plates 83 shown individually in Fig. 16. It will be noted that in Figs. 12 and 16 the first slot 30a has been lengthened relative to the second slot 35a. In a similar manner, although not shown, the upper end 36 of the second slot 35a could be increased relative to the upper end 32 of the first slot 30a. This difference in the height of the first and second slots 30a, 35a leads to an increase in the elongation of the two parallel arc portions 58, 60. Arc elongation not only occurs in a horizontal plane, as caused by the divergence of the first and second slots 30a, 35a, but also because of a difference in slot height arc elongation additionally occurs in a vertical plane, as will be obvious upon an inspection of Figs. 13 and 17 of the drawings. It will be remembered that because of the provision of the embossed ribs 73, there is no possibility for the two parallel arc portions 58, 60 merging into a shorter path 74 (Fig. 11) extending only between successive second slots **35*a*.**

Figure 14:
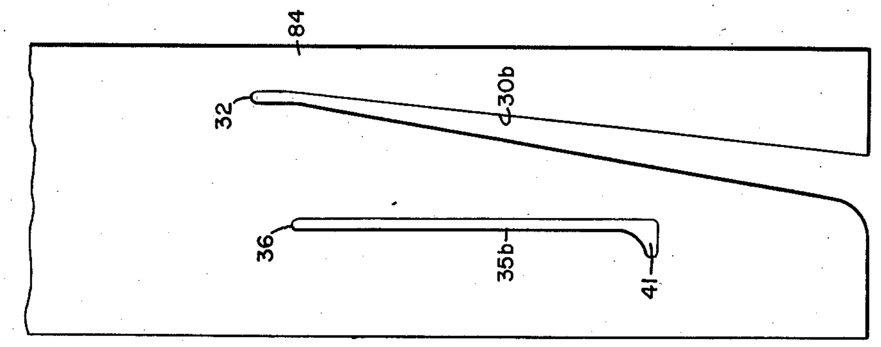
Fig. 14 illustrates a further modified type plate portion.
Figure 15:
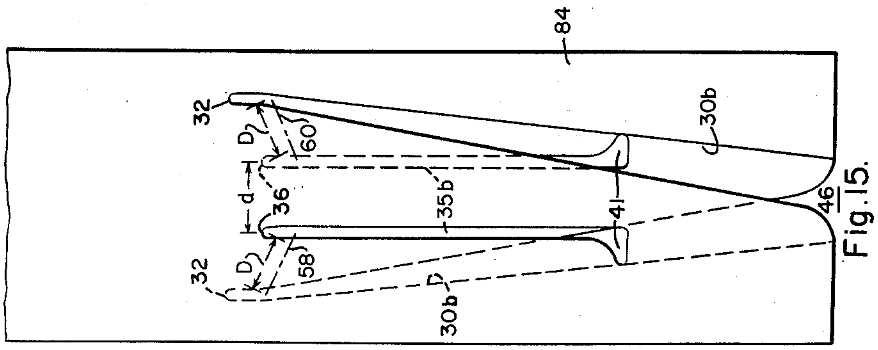
Fig. 15 illustrates an assemblage of the plate portions of the type shown in Fig. 14.

Figs. 14 and 15 illustrate a difference in the height of the first and second slots **30*b*, 35*b* in a plate 84, which has no raised or embossed portions 73. In other words, the unembossed plate 84, shown in Figs. 14 and 15, is of the general type of plate illustrated in Figs. 3 and 7 of the drawings. Here, it must be remembered, the offset distance D between the upper ends of the first and second slots 30*b*, 35*b*** must be less or equal but no more than the offset distance *d* between the upper ends of successive second slots **35*b*. If this condition is not met, arc transfer to a path involving only the upper ends of successive second slots 35*b* is a hazard, and the two parallel arcs 58, 60 may merge into a single arc extending only through the upper ends of successive second slots 35*b*.** For this reason, the offset distance D should be less, or at least no greater than the offset distance *d* between the upper ends of consecutive second slots **35*b*.**

In a similar manner, although not shown, the height of the upper ends 36 of the second slots **35*b* could be raised relative to the upper ends 32 of the first slots 30,** but here again it is necessary to provide the offset distance between the first and second slots D equal to or less than the offset distance *d* between the upper ends of consecutive second slots **35*b*,** for the reasons given above.

From the foregoing description of the invention, it will be apparent that there is provided an improved plate structure for subdividing an initially established single arc 51 into two parallel secondary arc portions 58, 60. The action is positive. The arc 51 is forced upwardly in a definite manner through the open first slots 30 in the first zone, and, upon an increase of arc length and restrictive action, breaks into two parallel arc portions 58, 60 when the first slots 30 overlap the enlarged portions 41 of the second slots 35. The breaking of the single arc 51 into two parallel arc portions 58, 60, thereby halving the current through each parallel arc portion 58, 60 and bringing about increased cooling of the arc portions all contributes toward rapid arc extinction and consequent high-speed circuit interruption.

The additional raised portions 73 upon one, or both sides of the plates permits a wider offset distance between the upper ends of the first and second slots, with no hazard that the parallel arc portions will merge into a single arc through only the upper ends of successive second slots. Additionally, the fact that the second slot 35 is closed, thereby enabling plate material indicated by the reference letter X (Fig. 3), being employed, results in a strong and mechanically rigid plate.

Figure 18:
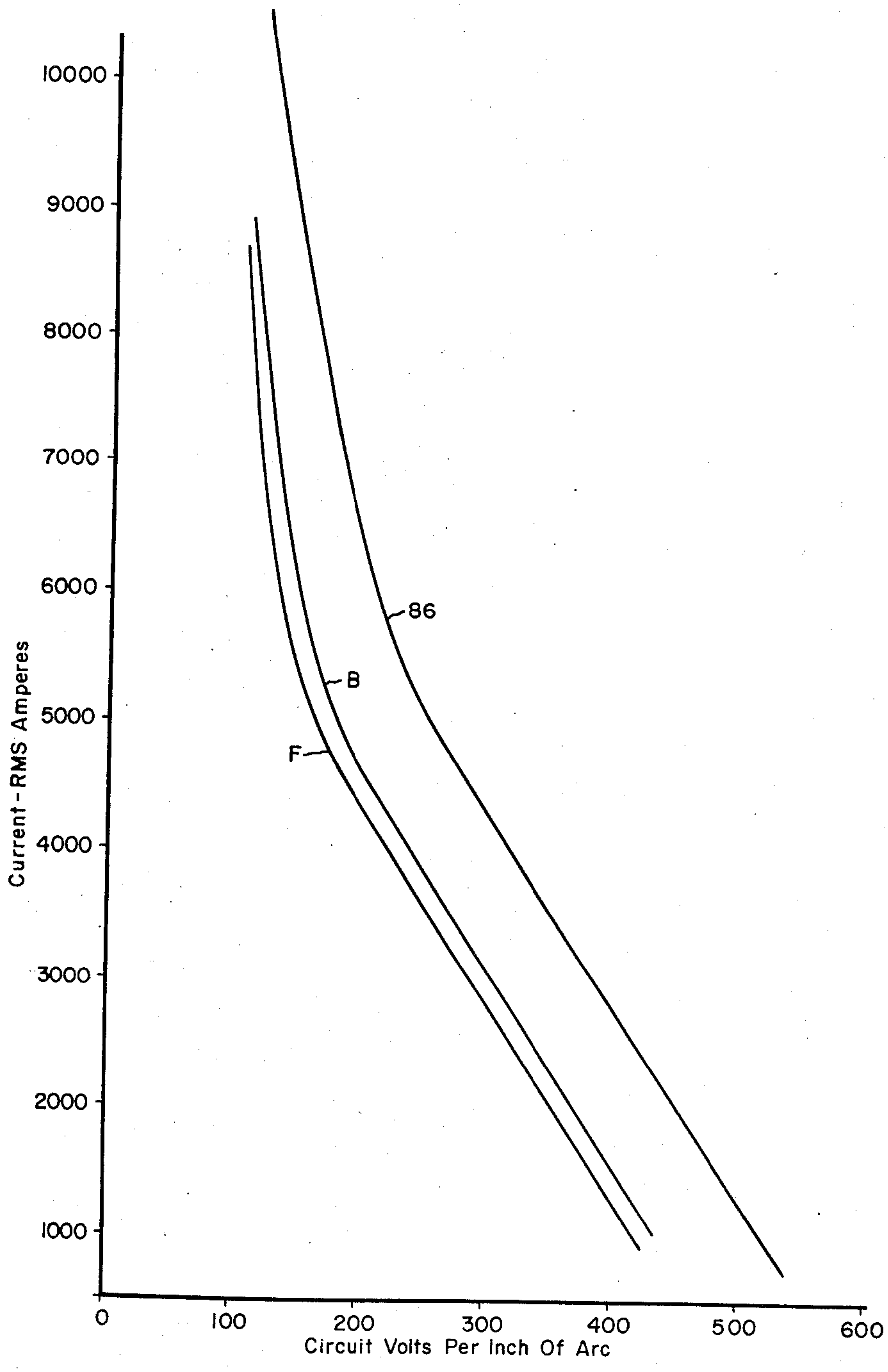
Fig. 18 illustrates graphically the improved results obtained by using an arc chute of the type illustrated in Fig. 2 as compared with prior art arc-chute configurations.

To illustrate the decided improvement in the method of arc extinction and the improved plate structure, attention is directed to Fig. 18 of the drawings, graphically illustrating the improvement in circuit interruption. The graph of Fig. 18 shows the current interrupted against the circuit volts per inch of arc length. The reference numeral 86 clearly shows the improved performance of a plate structure, illustrated in Fig. 2 of the drawings, as against an arc chute using alternate single and double slotted plates of the type set out and claimed in United States patent application filed April 7, 1955, Serial No. 499,970, now United States Patent 2,871,318, issued January 27, 1959 to Russell E. Frink and assigned to the assignee of the instant application. The curve B illustrates the interrupting ability of such a single and double slotted plate structure. The curve F illustrates the interrupting performance of an arc chute comprising a plurality of single slotted plates of the type set forth in Dickinson et al. Patent 2,442,199, issued May 25, 1948. It will be apparent that the curve denoted by the reference numeral 86 shows superior interrupting performance as contrasted with the other two types of arc-chute constructions. Curve 86, exemplifying the improved interrupting performance of the plate structure illustrated in Fig. 3 of the drawings, clearly shows the improved manner of arc extinction with a positive control exerted over the arc at all times.

In comparing the improved plate-type arc chute of the present invention with plate-type chutes previously used, it becomes evident that the interrupting ability of a given circuit breaker may be enhanced merely by replacing the arc chute plates of previous types with those of the present invention as disclosed herein. Alternatively, equal interrupting ability can be obtained by utilizing the improved plates of the present invention in an arc chute assembly of smaller physical size than one using plates of previous types.

Although there have been illustrated and described specific arc-chute structures, it is to be clearly understood that the same were merely for the purpose of illustration, and that changes and modifications may readily be made therein by those skilled in the art, without departing from the spirit and scope of the invention.

I claim as my invention:

1. A circuit interrupter including contact means for establishing initially a single arc, an arc chute for receiving said single arc and for causing its subsequent subdivision into two, generally parallel disposed arcs, each of said two arcs extending substantially the entire length of said arc chute, said arc chute including a multiplicity of spaced, parallel-disposed, elongated insulating plate portions extending generally transversely of said initially established single arc, a plurality of said elongated insulating plate portions each having only two slots, namely a first slot and a second slot, the first slot being tapered and open at the end of the elongated plate portion facing the contact means and closed at the other end thereof, said first slot extending generally longitudinally of the elongated plate portion, said second slot being closed at both ends and also extending generally longitudinally of the elongated plate portion, the first and second slots being laterially spaced apart with the closed end of the second slot nearest the contact means positioned an appreciable distance inwardly from said one end of the elongated plate portion, said spaced insulating plate portions being alternated so that the first slot of one plate overlies the second slot of the next plate, the alternated plate structure thus having, in effect, three zones, namely a first single-arc, zig-zag, restrictive introductory primary zone created by the divergence of successive first slots toward the exhaust end of the arc chute in causing the single initially established arc to become elongated in a zig-zag manner, a second parallel, double-arc, alignment secondary zone created by alignment of said closed ends of the second slots with intermediate portions of the first slots, whereby a pair of substantially straight, non-obstructed arc passages extend the entire length of the arc chute for effecting subdivision of the initially established single arc into two, substantially-parallel, secondary arcs through the two alignment passages, and a third parallel double-arc, zig-zag, restrictive tertiary zone caused by divergence of the first and second slots toward the exhaust end of the arc chute, whereby each of the two secondary arcs is lengthened in a zig-zag manner toward the exhaust end of the arc chute until extinction occurs.

2. The combination in a magnetic air-break circuit interrupter of contact means for establishing a single arc, a substantially rectangularly-shaped arc chute for receiving said single arc, the substantially rectangularly-shaped arc chute having side wall portions, end wall portions and a multiplicity of enlongated rectangular insulating plates, the rectangular plates being spaced apart and disposed substantially transversely of said single initially established arc, a plurality of the rectangular plates each having only two slots, namely a first slot and a second slot, the first slot being tapered and open at the end of the elongated plate facing the contact means and closed at the other end thereof, said first slot extending generally longitudinally of the elongated plate, said second slot being closed at both ends and also extending generally longitudinally of the elongated plate, the first and second slots being laterally spaced apart with the closed end of the second slot nearest the contact means positioned an appreciable distance inwardly from said one end of the elongated plate, said spaced insulating plates being alternated so that the first slot of one plate overlies the second slot of the next plate, the alternated plate structure thus having, in effect, three zones, namely a first single-arc, zig-zag, restrictive introductory primary zone created by the divergence of successive first slots toward the exhaust end of the arc chute in causing the single initially established arc to become elongated in a zig-zag manner, a second parallel, double-arc, alignment secondary zone created by alignment of said closed ends of the second slots with intermediate portions of the first slots, whereby a pair of substantially straight, non-obstructed arc passages extend the entire length of the arc chute for effecting subdivision of the initially established single arc into two, substantially-parallel, secondary arcs through the two alignment passages, and a third parallel double-arc, zig-zag, restrictive tertiary zone caused by divergence of the first and second slots toward the exhaust end of the arc chute whereby each of the two secondary arcs is lengthened in a zig-zag manner toward the exhaust end of the arc chute until extinction occurs.

3. A circuit interrupter including contact means for establishing initially a single arc, an arc chute for receiving said single arc and for causing its subsequent subdivision into two, generally parallel disposed arcs, each of said two arcs extending substantially the entire length of said arc chute, said arc chute including a multiplicity of spaced, parallel-disposed, elongated insulating plate portions extending generally transversely of said initially established single arc, a plurality of said elongated insulating plate portions each having only two slots, namely a first slot and a second slot, the first slot being tapered and open at the end of the elongated plate portion facing the contact means and closed at the other end thereof, said first slot extending generally longitudinally of the elongated plate portion, said second slot being closed at both ends and also extending generally longitudinally of the elongated plate portion, the first and second slots being laterally spaced apart with the closed end of the second slot nearest the contact means positioned an appreciable distance inwardly from said one end of the elongated plate portion, said spaced insulating plate portions being alternated so that the first slot of one plate overlies the second slot of the next plate, the first slots of the plate portions opening adjacent the central portion of the narrow edge of the plate portions facing the contact means, the alternated plate structure thus having, in effect, three zones, namely a first single-arc, zig-zag, restrictive introductory primary zone created by the divergence of successive first slots toward the exhaust end of the arc chute in causing the single initially established arc to become elongated in a zig-zag manner, a second parallel, double-arc, alignment secondary zone created by alignment of said closed ends of the second slots with intermediate portions of the first slots, whereby a pair of substantially straight, non-obstructed arc passages extend the entire length of the arc chute for effecting subdivision of the initially established single arc into two, substantially-parallel, secondary arcs through the two alignment passages, and a third parallel double-arc, zig-zag, restrictive tertiary zone caused by divergence of the first and second slots toward the exhaust end of the arc chute, whereby each of the two secondary arcs is lengthened in a zig-zag manner toward the exhaust end of the arc chute until extinction occurs.

4. A circuit interrupter including contact means for establishing initially a single arc, an arc chute for receiving said single arc and for causing its subsequent subdivision into two, generally parallel disposed arcs, each of said two arcs extending substantially the entire length of said arc chute, said arc chute including a multiplicity of spaced, parallel-disposed, elongated insulating plate portions extending generally transversely of said initially established single arc, a plurality of said elongated insulating plate portions each having only two slots, namely a first slot and a second slot, the first slot being tapered and open at the end of the elongated plate portion facing the contact means and closed at the other end thereof, said first slot extending generally longitudinally of the elongated plate portion, said second slot being closed at both ends and also extending generally longitudinally of the elongated plate portion, the first and second slots being laterally spaced apart with the closed end of the second slot nearest the contact means positioned an appreciable distance inwardly from said one end of the elongated plate portion, said spaced insulating plate portions being alternated so that the first slot of one plate overlies the second slot of the next plate, the alternated plate structure thus having, in effect, three zones, namely a first single-arc, zig-zag, restrictive introductory primary zone created by the divergence of successive first slots toward the exhaust end of the arc chute in causing the single initially established arc to become elongated in a zig-zag manner, a second parallel, double-arc, alignment secondary zone created by alignment of said closed ends of the second slots with intermediate portions of the first slots, whereby a pair of substantially straight, non-obstructed arc passages extend the entire length of the arc chute for effecting subdivision of the initially established single arc into two, substantially-parallel, secondary arcs through the two alignment passages, and a third parallel double-arc, zig-zag, restrictive tertiary zone caused by divergence of the first and second slots toward the exhaust end of the arc chute, whereby each of the two secondary arcs is lengthened in a zig-zag manner toward the exhaust end of the arc chute until extinction occurs, and raised ribs extending along at least one side of each of several plate portions between the first and second slots of the plate portions to prevent merger of the secondary arcs in the third zone of the arc chute.

5. A circuit interrupter including contact means for establishing initially a single arc, an arc chute for receiving said single arc and for causing its subsequent subdivision into two, generally parallel disposed arcs, each of said two arcs extending substantially the entire length of said arc chute, said arc chute including a multiplicity of spaced, parallel-disposed, elongated insulating plate portions extending generally transversely of said initially established single arc, a plurality of said elongated insulating plate portions each having only two slots, namely a first slot and a second slot, the first slot being tapered and open at the end of the elongated plate portion facing the contact means and closed at the other end thereof, said first slot extending generally longitudinally of the elongated plate portion, said second slot being closed at both ends and also extending generally longitudinally of the elongated plate portion, the first and second slots being laterally spaced apart with the closed end of the second slot nearest the contact means positioned an appreciable distance inwardly from said one end of the elongated plate portion, the distance of the closed end of the second slot in the direction of arc movement from the center-line of the plate portion is no less than one-third the distance of the closed end of the said first slot from the center-line of the plate portion, said spaced insulating plate portions being alternated so that the first slot of one plate overlies the second slot of the next plate, the alternated plate structure thus having, in effect, three zones, namely a first single-arc, zig-zag, restrictive introductory primary zone created by the divergence of successive first slots toward the exhaust end of the arc chute in causing the single initially established arc to become elongated in a zig-zag manner, a second parallel, double-arc, alignment secondary zone created by alignment of said closed ends of the second slots with intermediate portions of the first slots, whereby a pair of substantially straight, non-obstructed arc passages extend the entire lentgh of the arc chute for effecting subdivision of the initially established single arc into two, substantially-parallel, secondary arcs through the two alignment passages, and a third parallel double-arc, zig-zag, restrictive tertiary zone caused by divergence of the first and second slots toward the exhaust end of the arc chute, whereby each of the two secondary arcs is lengthened in a zig-zag manner toward the exhaust end of the arc chute until extinction occurs.

6. A circuit interrupter including contact means for establishing initially a single arc, an arc chute for receiving said single arc and for causing its subsequent subdivision into two, generally parallel disposed arcs, each of said two arcs extending substantially the entire length of said arc chute, said arc chute including a multiplicity of spaced, parallel-disposed, elongated insulating plate portions extending generally transversely of said initially established single arc, a plurality of said elongated insulating plate portions each having only two slots, namely a first slot and a second slot, the first slot being tapered and open at the end of the elongated plate portion facing the contact means and closed at the other end thereof, said first slot extending generally longitudinally of the elongated plate portion, said second slot being closed at both ends and also extending generally longitudinally of the elongated plate portion, the first and second slots being laterally spaced apart with the closed end of the second slot nearest the contact means positioned an appreciable distance inwardly from said one end of the elongated plate portion, the closed ends of the first and second slots toward the exhaust end of the arc chute being spaced unequal distances from the entrance end of the arc chute, said spaced insulating plate portions being alternated so that the first slot of one plate overlies the second slot of the next plate, the alternated plate structure thus having, in effect, three zones, namely a first single-arc, zig-zag, restrictive introductory primary zone created by the divergence of successive first slots toward the exhaust end of the arc chute in causing the single initially established arc to become elongated in a zig-zag manner, a second parallel, double-arc, alignment secondary zone created by alignment of said closed ends of the second slots with intermediate portions of the first slots, whereby a pair of substantially straight, non-obstructed arc passages extend the entire length of the arc chute for effecting subdivision of the initially established single arc into two, substantially parallel, secondary arcs through the two alignment passages, and a third parallel double-arc, zig-zag, restrictive tertiary zone caused by divergence of the first and second slots toward the exhaust end of the arc chute, whereby each of the two secondary arcs is lengthened in a zig-zag manner toward the exhaust end of the arc chute until extinction occurs.

7. A circuit interrupter including contact means for establishing initially a single arc, an arc chute for receiving said single arc and for causing its subsequent subdivision into two, generally parallel disposed arcs, each of said two arcs extending substantially the entire length of said arc chute, said arc chute including a multiplicity of spaced, parallel-disposed, elongated insulating plate portions extending generally transversely of said initially established single arc, a plurality of said elongated insulating plate portions each having only two slots, namely a first slot and a second slot, the first slot being tapered and open at the end of the elongated plate portion facing the contact means and closed at the other end thereof, said first slot extending generally longitudinally of the elongated plate portion, said second slot being closed at both ends and also extending generally longitudinally of the elongated plate portion, the first and second slots being laterally spaced apart with the closed end of the second slot nearest the contact means positioned an appreciable distance inwardly from said one end of the elongated plate portion, the first and second slots being disposed on opposite sides of the center-line of the elongated plate portions, said spaced insulating plate portions being alternated so that the first slot of one plate overlies the second slot of the next plate, the alternated plate structure thus having, in effect, three zones, namely a first single-arc, zig-zag, restrictive introductory primary zone created by the divergence of successive first slots toward the exhaust end of the arc chute in causing the single initially established arc to become elongated in a zig-zag manner, a second parallel, double-arc, alignment secondary zone created by alignment of said closed ends of the second slots with intermediate portions of the first slots, whereby a pair of substantially straight, non-obstructed arc passages extend the entire length of the arc chute for effecting subdivision of the initially established single arc into two, substantially-parallel, secondary arcs through the two alignment passages, and a third parallel double-arc, zig-zag, restrictive tertiary zone caused by divergence of the first and second slots toward the exhaust end of the arc chute, whereby each of the two secondary arcs is lengthened in a zig-zag manner toward the exhaust end of the arc chute until extinction occurs.

References Cited in the file of this patent

UNITED STATES PATENTS

| | | |
|---|---|---|
| 2,750,476 | Latour | June 12, 1956 |
| 2,871,318 | Frink | Jan. 27, 1959 |
| 2,871,319 | Dickinson | Jan. 27, 1959 |